United States Patent [19]

Takeuchi

[11] Patent Number: 5,869,867
[45] Date of Patent: *Feb. 9, 1999

[54] FET SEMICONDUCTOR INTEGRATED CIRCUIT DEVICE HAVING A PLANAR ELEMENT STRUCTURE

[75] Inventor: Kiyoshi Takeuchi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 814,992

[22] Filed: Mar. 14, 1997

[30] Foreign Application Priority Data

Mar. 19, 1996 [JP] Japan ................................ 8-063551

[51] Int. Cl.$^6$ .................................................. H01L 27/12
[52] U.S. Cl. .......................... 257/347; 257/773; 257/776
[58] Field of Search .................................. 257/347, 773, 257/774, 776

[56] References Cited

U.S. PATENT DOCUMENTS

| | | | |
|---|---|---|---|
| 4,902,637 | 2/1990 | Kondou et al. | 257/347 |
| 5,041,884 | 8/1991 | Kumamoto et al. | 257/347 |
| 5,347,154 | 9/1994 | Takahashi et al. | 257/347 |
| 5,670,812 | 9/1997 | Adler et al. | 257/347 |
| 5,675,185 | 10/1997 | Chen et al. | 257/774 |

FOREIGN PATENT DOCUMENTS

| | | | |
|---|---|---|---|
| 62139356 | 6/1987 | Japan . | |
| 4-280671 | 10/1992 | Japan | 257/347 |

*Primary Examiner*—David B. Hardy
*Attorney, Agent, or Firm*—Whitham, Curtis & Whitham

[57] ABSTRACT

In a semiconductor device, an extra wiring area generated by the connection of an upper layer wiring to an element on a semiconductor substrate is reduced to improve the level of integration, and the parasitic capacitances between the gate and the source-drain regions are reduced to enhance the performance of the circuit.

A gate electrode is formed via a gate insulating film on a semiconductor layer formed in the semiconductor substrate. This semiconductor layer is for forming the source region and the drain region, where the source region and the drain region are formed on the left and right of the gate electrode with the gate electrode at the center. Wirings connected to the source region are formed on the same side of the gate electrode. Wirings connected to the drain region are formed on the opposite side of the gate electrode with the semiconductor layer in between.

16 Claims, 3 Drawing Sheets

FET SEMICONDUCTOR INTEGRATED CIRCUIT DEVICE HAVING A PLANAR ELEMENT STRUCTURE

BACKGROUND OF THE INVENTION

1. Field of the Invention

The present invention relates to a semiconductor device, and more particularly to a semiconductor device having a planar element structure, and its manufacture.

2. Description of the Prior Art

In nearly all practical cases, wirings are formed on only one side of a semiconductor substrate of a semiconductor device such as a metal-insulator-semiconductor field-effect transistor (MISFET) formed on the surface of the substrate. Formation of wirings on the front side of the substrate is a natural idea and is easy to execute as well. Namely, it needs only to deposit an insulating film on the front surface of the substrate, open through holes in the insulating film, and form wirings over the holes.

On the other hand, wirings are made intricate and high density along with the increase in the density of the semiconductor devices resulting from miniaturization of the elements. This situation can be handled by providing a plurality of wiring layers, which can be achieved by repeating successively the deposition of the insulating layer and the formation of the wirings. In this way, it is possible to lay intricate wirings, and suppress the parasitic capacitance between the wirings by reducing the wiring density per layer and elevate the performance of the semiconductor device as well.

However, a wiring has generally to be connected eventually to some kind of element on the substrate. Now, as the number of wirings layers increase, extra areas are required to connect the upper layer wirings to the elements on the substrate. This is because when a wiring in an upper layer is connected to an element on the substrate, it becomes necessary for a wiring on a lower layer to detour around the connection section, and this tendency becomes more conspicuous as the number of the wiring layers increases. This fact obstructs the increase in the level of integration of the wirings, and eventually that of the semiconductor device as a whole.

Under these circumstances, formation of wirings on the rear surface of the semiconductor device is proposed in Japanese Laid-Open Patent Publication No. 62-139356. In general, in a vertical bipolar transistor consisting of an emitter, base and collector, the collector layer is formed at a position with the largest depth of the substrate. For this reason, it is general to realize the connection of a wiring on the front surface of the substrate to the collector by extending the collector layer sideways so as to avoid the transistor region. However, it results in a problem that the level of integration cannot be improved because of an extra area required for extending the collector sideways.

In Japanese Laid-Open Patent Publication No. 62-139356, it is shown that the extra area can be saved by forming a wiring to be connected with the collector on the rear surface of the substrate. Note, however, that this effect is peculiar to the bipolar transistor, and that a similar effect cannot be expected in particular for the MISFET having a planar element structure.

Another problem of a semiconductor device using miniaturized MISFETs is that of the parasitic capacitances arising from the proximity of the gate electrode to the wirings connected to the source and drain regions. Namely, as a result of reduction, along with the miniaturization, in the distances between the gate electrode and the wirings connected to the source and drain regions the parasitic capacitances are increased and the element performance is deteriorated. In particular, the parasitic capacitance generated between the gate electrode and the wiring of the drain region in the FET spoils substantially the performance of the miniaturized FET owing to the so-called Miller effect (a phenomenon in which the effect of a capacitance found between the input terminal and the output terminal is amplified).

As in the above, in a semiconductor device such as a MISFET having the gate electrode, source region and drain region as a planar element structure, there is a problem that when a multilayer interconnection is employed, the number of arrangeable wirings does not increase in proportion to the number of the wiring layers. The reason for this is that it is necessary to secure extra areas for connecting wirings on upper layers to elements on the substrate, and that wirings on intermediate layers have to detour around the extra areas. Besides, in the MISFET there is a problem that the parasitic capacitances between the gate electrode and the wirings of the source and drain regions are increased along with the miniaturization of the FET. This problem arises from the fact that the distances between the gate electrode and the wirings of the source and drain regions are diminished.

SUMMARY OF THE INVENTION

It is therefore the object of this invention to provide a semiconductor device which improves the level of integration by eliminating the extra wiring areas required by the connection of the wirings on upper layers to the elements on the substrate, reduces the parasitic capacitances generated between the gate electrode and the wirings of the source and drain regions and elevates the circuit performance, and a method of manufacturing the device.

In order to achieve the above object, a semiconductor device according to a first mode of this invention is a semiconductor device comprising a gate electrode, source and drain regions and wirings, wherein the gate electrode is formed on a semiconductor substrate via a gate insulating layer, the source and drain regions are formed in the semiconductor substrate on the left and right of the gate electrode with the gate electrode at the center, and the wirings are those connected to the source region and the drain region of which at least one of them is formed on the opposite side of the gate electrode.

At least one of the wirings of the source region or the drain region situated adjacent to the gate electrode of the semiconductor device is formed on the rear surface of the substrate on the opposite side of the gate electrode to reduce the parasitic capacitance generated between the gate electrode and the wiring of the source region or the drain electrode. Besides, the wiring area on the front surface side of the substrate is reduced by forming at least one of the wirings of the source region and the drain electrode on the rear surface of the substrate on the opposite side of the gate electrode.

BRIEF DESCRIPTION OF THE DRAWINGS

The above and other objects, advantages and features of the present invention will be more apparent from the following description taken in conjunction with the accompanying drawings, in which.

DESCRIPTION OF PREFERRED EMBODIMENTS

Figure 1A:
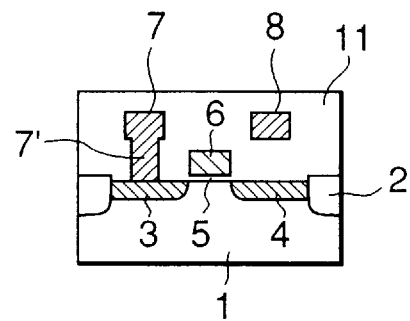
FIGS. 1(a) to 1(d) illustrate sectional views showing the order of the manufacturing processes of a first embodiment of the invention.

Referring to the drawings, the present invention will be described in the following.

Figure 1B:
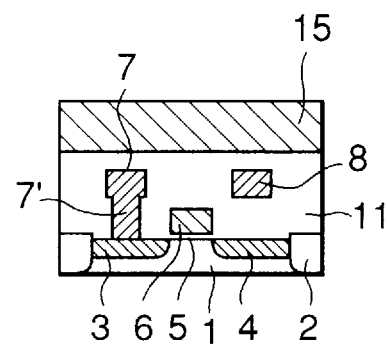

FIGS. 1(a) to 1(b) illustrate sectional views showing the order of the processes of the manufacturing method of the semiconductor device according to the first embodiment of this invention.

Figure 1C:
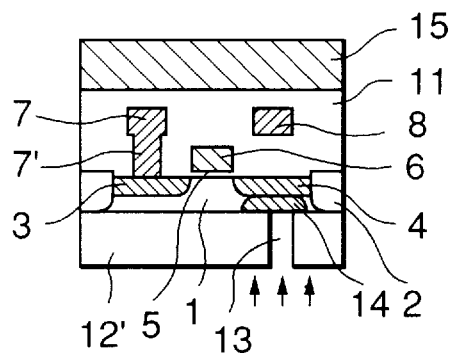
Figure 1D:
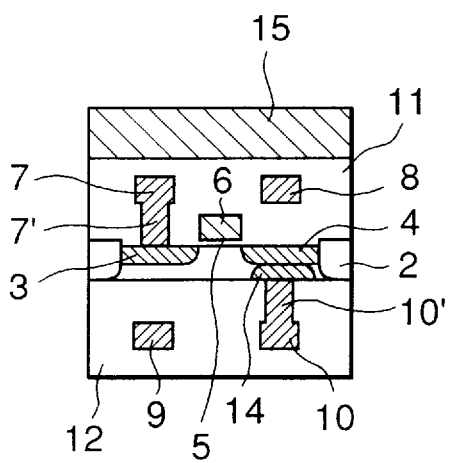

As shown in FIG. 1(d), the semiconductor device according to this invention includes a gate electrode 6, a source region 3, a drain electrode 4 and wirings 7, 7' and 10, 10' as the basic constituents.

The gate electrode 6 is formed on upper surface of a semiconductor substrate 1 via a gate insulating film 5. The source region 3 and the drain region 4 are formed in the semiconductor substrate 1 on the left and right of the gate electrode 6 with the gate electrode at the center.

The wirings 7, 7' and 10, 10' are the wirings connected to the source region 3 and the drain region 4, respectively. The wirings 7 and 7' are formed connected to the source region 3 within a layer insulating film 11 on the gate electrode 6 side. The wirings 10 and 10' are formed connected to the drain region 4 within a layer insulating film 12 on the side opposite to the gate electrode 6 (rear surface of the substrate). The reference symbols 8 and 9 represent the wirings.

The semiconductor device according to the first embodiment of this invention shown in FIG. 1(d) has a connection diffused layer 14 in addition to the basic constituents described above. The connection diffused layer 14 is formed on the opposite side of the gate region 6 making contact with the drain electrode 4, and acts to join the wirings 10 and 10' to the drain region 4.

Next, the method of manufacturing the semiconductor device according to the first embodiment of this invention will be described in the order of the processes.

FIGS. 1(a) to 1(c) show an embodiment when the MISFET is adopted as the semiconductor device. The method of manufacture of the semiconductor device (MISFET) according to the first embodiment of this invention includes a gate electrode formation process, source-drain regions formation process, front side wiring process, polishing process, through hole formation process, diffused layer formation process and rear side wiring process.

As shown in FIG. 1(a), in the gate electrode formation process, after the formation of an element isolation insulating film 2 on the surface of a semiconductor substrate 1 by a selective oxidation method or a trench isolation method, a gate electrode 6 is formed on the surface of the semiconductor substrate 1 via a gate insulating film 5.

Next, in the source-drain regions formation process, a source region 3 and a drain region 4 are formed in the semiconductor substrate 1 adjacent to and on the left and right of the gate electrode 6 by, for example, ion implantation.

Next, in the front side wiring process, a layer insulating film 11 covering the gate electrode 6, the source and drain regions 3 and 4 is deposited by, for example, CVD method, a through hole is drilled in the layer insulating film 11, and a wiring, not shown, connected to the gate electrode 6 and wirings 7 and 7' connected to the source region 3 via the through hole are formed.

The wirings 7, 7' and 8 may be formed by using an aluminum alloy or a copper alloy as the material. Besides, in the case of fine wirings, it is general to use metallic plugs of tungsten or the like obtained by CVD for the connection of one wiring to another or a wiring to an element (for example, the wiring 7' in FIG. 1(a)) on the substrate.

Parenthetically, it should be mentioned that, although the case of one wiring layer per side of the substrate is shown in the figure, two or more wiring layers may be formed as needed. For that purpose one is only required to repeat sequentially the deposition of an insulating film, opening of through holes for connection of wirings, and formation of the wirings.

Then, the wirings 7 and 8 are covered with a layer insulating film 11 using CVD or the like (FIG. 1(a)). The processes up to this stage are the same as in the manufacturing method of the conventional MISFET.

Next, a supporting substrate 15 is bonded to the front side of the semiconductor substrate 1. Silicon, glass or the like which has a sufficient strength for supporting the front side of the substrate during the abrasion of the rear surface of the semiconductor substrate 1 is used as the material for the supporting substrate 15. Bonding is achieved by coating a polymeric resin such as an epoxy on the bonding surface of the semiconductor substrate or the supporting substrate 15 and then applying a pressure to the surface of contact.

Next, in the polishing process, as shown in FIG. 1(b), the rear surface of the semiconductor substrate 1 is polished to a small thickness of 10 to 500 nm which is the height of an element isolation insulating film 2. When the element isolation insulating film 2 is utilized as the stopper of polishing, it is possible to adjust the final thickness of the semiconductor substrate 1 by the height of the element isolation insulating film 2. In order to achieve this, it is only necessary to carry out mechanochemical polishing by using colloidal silica as the abrasive grains and an organic amine as the chemical solution.

Next, as shown in FIG. 1(c), in the through hole formation process, a through hole 13 reaching the rear surface of the semiconductor substrate 1 is formed at the position corresponding to the drain electrode 4 in a layer insulating film 12' deposited on the rear surface of the semiconductor substrate 1 after completion of the polishing.

Next, in the diffused layer formation process, a connection diffused layer 14 joined to the drain region 4 is formed on the rear surface of the semiconductor substrate 1 by ion implantation via the through hole 13.

Finally, as shown in FIG. 1(d), in the rear side wiring process, metallic wirings 10 and 10' of an aluminum alloy or a copper alloy are formed joined to the diffused layer 14 by passing them via the through hole 13 in a layer insulating film 12 thickly deposited on the rear surface of the semiconductor substrate 1. Finally, an insulating layer is deposited again on the rear side to cover the wirings.

Figure 2:
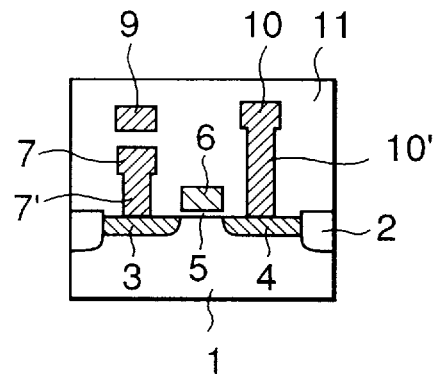
FIG. 2 is a sectional view showing the prior art.

The semiconductor device, especially the MISFET, according to this invention shown in FIG. 1(d) as obtained in this manner has a feature in that the wiring processing is carried out for both surfaces of the semiconductor substrate 1. Consequently, the total number of wirings on one surface of the substrate 1 is equal to half the number of wiring layers, realizing an arrangement with high density of wirings. FIG. 2 shows the case of realizing the two wiring layers the same as in FIG. 1(d) by the use of the conventional method.

Figure 3A:
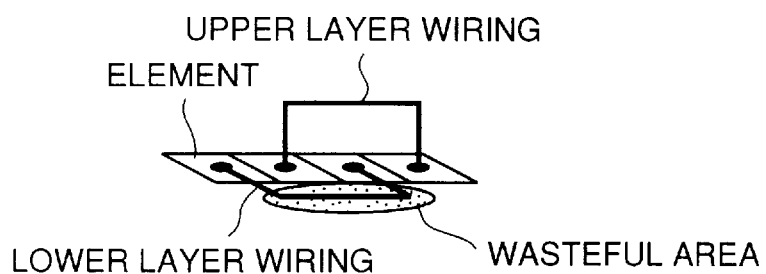
FIGS. 3(a) to 3(b) illustrate sectional views showing a comparison of the present invention and the prior art.
Figure 3B:
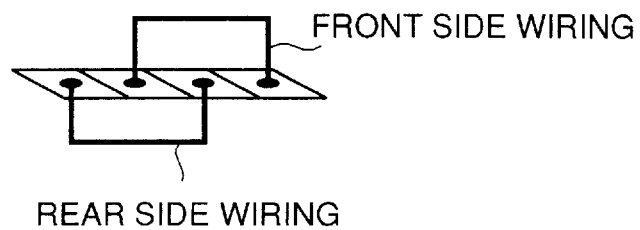

FIGS. 3(a) to 3(b) are for illustrating the reason why the present device shown in FIG. 1(d) enables to elevate the wiring density over that of the conventional method with reference to the comparison of the device in FIG. 1(d) and FIG. 2. It is to be reminded that all the wirings have eventually to be connected to the elements on the semiconductor substrate, but it is not possible to form a wiring of a lower layer in the region where a wiring of an upper layer is connected to an element on the semiconductor substrate. Therefore, in the prior art shown in FIG. 3(a), a lower layer wiring has to detour around the connection section of an upper layer wiring, and thus consumes a wasteful area marked by an ellipse. On the other hand, in the present invention as shown in FIG. 3(b), wirings are formed isolated on both sides of the substrate so that the above-mentioned restriction can be removed, making it possible to arrange the wirings without consuming an extra area.

Moreover, the MISFET according to this invention shown in FIG. 1(d) possesses a feature in that the wirings 10 and 10' connected to the drain region 4 are formed on the rear surface of the substrate which is on the opposite side of the gate electrode. In the conventional structure shown in FIG. 2, the gate electrode 6 and the wirings 10 and 10' of the drain region 4 have to be situated adjacent with each other. In this case, the distance between the two is diminished because of the miniaturization of the elements, and the parasitic capacitance between them causes the deterioration in the performance of the circuit. In FIG. 1(d), however, the wirings 10 and 10' connected to the drain region 4 are formed on the side opposite to the gate electrode 6, so that there is no capacitive coupling between the gate electrode 6 and the wirings 10 and 10' and can prevent the above-mentioned deterioration of the performance.

Moreover, the drain region 4 is normally connected to the output terminal of the logic gate so that its parasitic capacitance between the gate electrode (normally acting as the input terminal) shows a larger degree of deterioration of the circuit performance than the parasitic capacitance between the source region 3 and the wiring of the gate electrode does because of the Miller effect. Although the parasitic capacitance between the gate electrode and the wiring of the source electrode is small, it is still desirable to reduce it. Accordingly, the wirings 7 and 7' connected to the source region 3 may also be formed on the opposite side of the gate electrode 6 similar to the wirings 10 and 10', though an example is shown in FIG. 1(d) where only the wirings 10 and 10' connected to the drain region 4 are formed on the opposite side of the gate electrode 6.

Figure 4A:
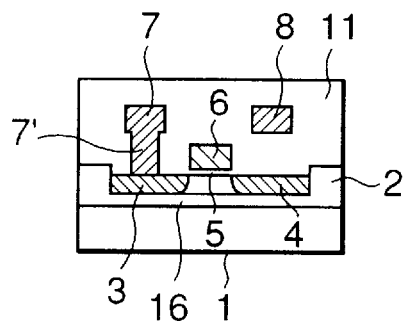
FIGS. 4(a) to 4(b) illustrate sectional views showing the order of the manufacturing processes of a second embodiment of the invention.
Figure 4B:
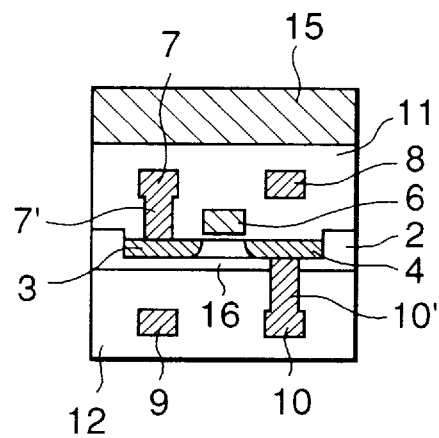

FIGS. 4(a) to 4(b) show an embodiment in which semiconductor-on-insulator (SOI) substrate is used. Its method of manufacture is basically the same as in FIGS. 1(a) to 1(d).

The semiconductor device according to the second embodiment of this invention has a constitution which includes a gate region 6, a source-drain electrode 3, 4 and wirings 7, 7', and 10, 10' as the basic constituents, which is substantially the same as that of the first embodiment shown in FIG. 1(d). The semiconductor device according to the second embodiment of this invention shown in FIGS. 4(a) to 4(b) has an buried insulating film 16 in addition to the basic constituents mentioned in the above. The buried insulating film 16 is formed joined to the source region 3 and the drain region 4 on the opposite side of the gate electrode 6, and it has a through hole in it. The wirings 10 and 10' are connected to the drain region 4 via the through hole in the buried insulating film 16.

The method of manufacture of the semiconductor device according to the second embodiment of this invention includes an element isolation process, a gate electrode formation process, a source-drain electrodes formation process, a front side wiring process, a polishing process and a rear side wiring process.

As shown in FIG. 4(a), in the element isolation process, an element isolation insulating film 2 and an buried insulating film 16 are formed integrally on the front surface of a semiconductor substrate 1. In the gate electrode formation process, a gate electrode 6 is formed on the SOI substrate 1 via a gate insulating film 5.

Next, in the source-drain region formation process, source and drain regions 3 and 4 are formed within the SOI substrate 1 on the left and right of the gate electrode 6 with the gate electrode at the center.

Next, in the front side wiring process, a wiring, not shown, connected to the gate electrode 6 and wirings 7 and 7' connected to the source region 3 are formed in a layer insulating film 11 covering the gate electrode 6 and the source and drain regions 3 and 4.

Next, in the polishing process, after bonding a supporting substrate 15 on the front surface of the semiconductor substrate 1, the rear surface of the SOI substrate 1 is polished until it reaches the buried insulating film 16.

When the SOI substrate is adopted, it is possible to use the buried insulating film 16 as the stopper in polishing the rear surface of the semiconductor substrate 1. In that case, it has an advantage that the polishing can be stopped with higher precision since the buried insulating film 16 is formed extending over the entire rear surface of the substrate 1. A separation-by-implanted oxygen (SIMOX) substrate or a laminated substrate, for example, is used as the substrate. In FIG. 4 is show the case where the depth of the source electrode 3 and the drain region 4 is reaching the buried insulating film 16. In that case, the process of forming the diffused layer 14 in FIG. 1(c) is unnecessary.

Next, as shown in FIG. 4(b), in the rear side wiring process, wirings 10 and 10' reaching the drain electrode 4 is formed in a layer insulating film 12 covering the exposed buried insulating film 16.

In this manner, an effect similar to that of the first embodiment can be obtained in the second embodiment of this invention. Besides, in the second embodiment of this invention, the process of forming a connection diffused layer 14 can be eliminated since the depth of the source region 3 and the drain region 4 reaches the buried insulating film 16. An example in which only the wirings 10 and 10' connected to the drain region 4 are formed on the opposite side of the gate electrode 6 in FIG. 4(b), but both the wirings 7, 7' and 10, 10' connected to the source region 3 and the drain region 4, respectively, may be formed on the opposite side of the gate electrode 6.

Figure 5:
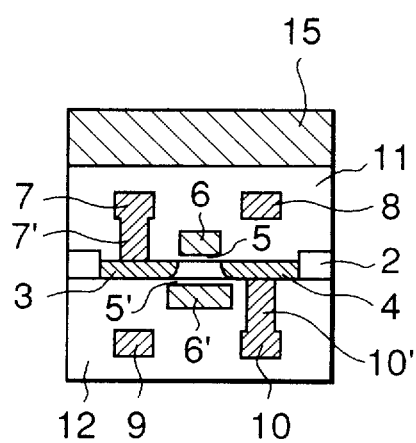
FIG. 5 is a sectional view showing a third embodiment of the invention.

In FIG. 5 showing the third embodiment of this invention, there are formed gate electrodes 6 and 6' in both the front and rear surfaces of the semiconductor substrate 1. It is a sectional view showing an embodiment in which this invention is applied to the so-called double gate MISFET that can active high device performance.

The method of manufacturing the semiconductor device according to the third embodiment of this invention shown in FIG. 5 includes a first gate electrode formation process, a source-drain regions formation process, a front side wiring process, a polishing process, a second gate electrode formation process, a through hole formation process, a diffused layer formation process, and a rear side wiring process.

As shown in FIG. 5, in the first gate electrode formation process, a first gate electrode 6 is formed on the front surface of a semiconductor substrate 1 via a gate insulating film 5.

Next, in the source-drain regions formation process, source and drain regions 3 and 4 are formed on the left and right of the gate electrode 6 with the gate electrode 6 at the center.

Next, in the front side wiring process, a wiring, not shown, connected to the gate electrode 6 and wirings 7 and 7' connected to the source region 3 are formed in a layer insulating film 11 covering the gate electrode 6 and the source and drain regions 3 and 4.

Next, in the polishing process, the source and drain regions 3 and 4 are exposed by polishing the rear surface of the semiconductor substrate 1 to the bottom of the element isolation insulating film 2.

Next, in the second gate electrode formation process, a second gate electrode 6' is formed on the polished rear surface of the semiconductor substrate 1 on the side opposite to the gate electrode 6 via a gate insulating film 5'.

Finally, in the rear side wiring process, a through hole is formed in a layer insulating film 12 covering the second gate electrode 6' and the source and drain regions 3 and 4, and a wiring, not shown, connected to the second gate electrode 6' and wirings 10 and 10' connected to the drain region 4 are formed via the through hole in the layer insulating film 12.

In realizing a double MISFET it is necessary to polish the substrate. This embodiment has an advantage in that the wiring processes on both sides of the substrate can also be made to serve as the polishing process. However, the effect of reducing the parasitic capacitance of the connection part of the gate electrode and the wiring cannot be expected to be obtainable by the formation of the double surface wirings, so that the improvement in the wiring density is the major effect of the third embodiment of this invention. Note that it is desirable to make the source region 3 and the drain region 4 exposed after the polishing in order to obtain excellent transistor characteristics.

In the above, examples have been illustrated in which a wiring layer is formed on each surface of the substrate for the sole purpose of simplifying the drawings. However, it is obvious that the formation of two or more layers of wiring on respective surfaces can be done easily by applying the conventional formation method of multilayer interconnection.

As described in the above, according to this invention it is possible by forming wirings also on the rear surface of the substrate to reduce the number of wiring layers on the surface of one side of the substrate, reduce the wasteful areas for detouring around the connected sections of the wirings and the elements, and elevate the level of integration of the semiconductor device by arranging the wirings with high density.

Moreover, by forming a wiring connected to the source or drain region on the opposite side of the gate electrode, it is possible to prevent the adjacency of the wiring and the gate electrode to eliminate the parasitic capacitance between the two, and improve the operating speed of the circuit.

Furthermore, by adopting the process of forming gate electrodes on both surfaces of the semiconductor substrate it is possible to achieve the polishing process of the substrate and the formation process of wirings on both sides at the same time.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. A metal-insulator-semiconductor field effect transistor type (MISFET) semiconductor integrated circuit device, comprising a gate electrode formed on one principal surface of a semiconductor substrate, a diffused source region, a diffused drain region, and a gate wiring connected to said gate electrode, wherein at least one of a source wiring connected to said diffused source region and a drain wiring connected to said diffused drain region is a rear surface wiring formed on a rear surface which is opposite to said one principal surface of said semiconductor substrate, wherein said rear surface wiring is a metallic wiring and said source wiring and said drain wiring each connect said source region and said drain region, respectively, to elements on said semiconductor substrate.

2. The MISFET semiconductor integrated circuit device as claimed in claim 1, wherein said rear surface wiring is connected to said diffused source region or said diffused drain region via a through hole opened in an insulating film formed on said rear surface of said semiconductor substrate.

3. The MISFET semiconductor integrated circuit device as claimed in claim 2, wherein said rear surface wiring is connected to said diffused source region or said diffused drain region via a connection diffused layer joined to one of said diffused regions.

4. The MISFET semiconductor integrated circuit device as claimed in claim 1, wherein said semiconductor substrate is a semiconductor-on-insulator (SOI) type semiconductor substrate.

5. The MISFET semiconductor integrated circuit device as claimed in claim 4, wherein said rear surface wiring is a metallic wiring connected to said diffused source region or said diffused drain region via a through hole opened in an insulating film of said SOI type semiconductor substrate.

6. The MISFET semiconductor integrated circuit device as claimed in claim 5, wherein said rear surface wiring is connected directly to said diffused source region or said diffused drain region.

7. The MISFET semiconductor integrated circuit device as claimed in claim 5, wherein the insulating film of said SOI type semiconductor substrate is formed of an buried insulating film.

8. The MISFET semiconductor integrated circuit device as claimed in claim 5, wherein said SOI type semiconductor substrate is an SIMOX substrate.

9. The MISFET semiconductor integrated circuit device as claimed in claim 1, wherein said rear surface wiring is formed of a metallic material selected from the group consisting of an aluminum alloy and a copper alloy.

10. The MISFET semiconductor integrated circuit device as claimed in claim 1, wherein said semiconductor substrate is a single planar element structure.

11. A field effect transistor semiconductor device comprising a gate electrode, source-drain regions, and metallic wirings, wherein the gate electrode is formed on a semiconductor substrate via gate insulating film, the source and the drain regions are formed in said semiconductor substrate on left and right sides of said gate electrode with the gate electrode at the center, and the wirings are source wirings and drain wirings connected to said source region and said drain region respectively, at least one of said source wiring and drain wiring is formed on of said gate electrode and wherein said source wiring and said drain wiring each connect said source region and said drain region, respectively, to elements on said semiconductor substrate.

12. The semiconductor device as claimed in claim 11, further comprising a connection diffused layer, wherein the connection diffused layer is formed on the opposite side of said gate electrode making contact with at least one of the source region and the drain region, and said wirings are connected to at least one of the source electrode and the drain region via said connection diffused layer.

13. The semiconductor device as claimed in claim 11, further comprising a buried insulating film, wherein the buried insulating film has a through hole in it and is formed joined to said source region and said drain region on the opposite side of said gate electrode, and said wirings are connected to at least one of the source region and the drain region via the through hole in said buried insulating film.

14. The semiconductor device as claimed in claim 11, wherein said gate electrode consists of two parts formed respectively on the front and rear sides of the semiconductor substrate sandwiching said source and drain regions via respective gate insulating films.

15. The semiconductor device as claimed in claim 11, wherein said wirings are formed of a metallic material selected from the group consisting of an aluminum alloy and a copper alloy.

16. The semiconductor device as claimed in claim 11, wherein said semiconductor substrate is a single planar element structure.

* * * * *